US009414481B1

(12) United States Patent
Tu et al.

(10) Patent No.: US 9,414,481 B1
(45) Date of Patent: Aug. 9, 2016

(54) HEAT SINK FASTENER

(71) Applicant: COOLER MASTER TECHNOLOGY INC., New Taipei (TW)

(72) Inventors: Wen-Ping Tu, New Taipei (TW); Yu-Qing Lyu, New Taipei (TW)

(73) Assignee: COOLER MASTER TECHNOLOGY INC., New Taipei (TW)

( * ) Notice: Subject to any disclaimer, the term of this patent is extended or adjusted under 35 U.S.C. 154(b) by 4 days.

(21) Appl. No.: 14/677,335

(22) Filed: Apr. 2, 2015

(51) Int. Cl.
*H05K 1/02* (2006.01)
*H05K 7/20* (2006.01)
*G06F 1/20* (2006.01)

(52) U.S. Cl.
CPC ........ *H05K 1/0203* (2013.01); *H05K 2201/064* (2013.01); *H05K 2201/066* (2013.01)

(58) Field of Classification Search
CPC .............. H05K 7/20; H05K 7/00; G06F 1/20; G06F 9/00; F28F 7/00; F28F 9/00; F28D 15/00; F28D 15/02; H01L 23/34; H01L 23/40; H01L 23/3672; H01L 23/427; H01L 23/467
USPC ............. 361/679.46, 679.48, 679.52, 679.54, 361/688, 700–704, 705, 709, 710, 719, 720, 361/721, 722; 165/80.2, 80.3, 80.4, 80.5, 165/104.21, 104.26, 104.33, 185; 257/706–727; 174/15.1, 15.2, 16.3, 174/252; 24/297, 453, 457, 458, 508; 248/505, 510
See application file for complete search history.

(56) References Cited

U.S. PATENT DOCUMENTS

| | | | | |
|---|---|---|---|---|
| 6,625,021 B1 * | 9/2003 | Lofland | ............... | H01L 23/4093 165/104.33 |
| 7,174,951 B1 * | 2/2007 | Lin | ........................ | F28D 15/02 165/104.21 |
| 7,277,287 B2 * | 10/2007 | Chen | .................... | H01L 23/4006 165/104.33 |
| 7,347,249 B2 * | 3/2008 | Lin | ..................... | H01L 23/4006 165/104.33 |
| 7,443,679 B2 * | 10/2008 | Li | ........................ | H01L 23/4006 165/104.33 |
| 7,719,840 B2 * | 5/2010 | Lin | ..................... | H01L 23/4006 361/679.54 |
| 7,729,119 B2 * | 6/2010 | Yang | ..................... | H01L 23/467 165/104.33 |
| 8,320,130 B2 * | 11/2012 | Yang | ................... | H01L 23/3672 165/185 |
| 2006/0126301 A1 * | 6/2006 | Lee | ..................... | H01L 23/3672 361/704 |
| 2008/0128111 A1 * | 6/2008 | Zhou | ..................... | H01L 23/427 165/80.3 |
| 2008/0298013 A1 * | 12/2008 | Li | ........................ | H01L 23/4093 361/688 |
| 2009/0050308 A1 * | 2/2009 | Kuo | ..................... | H01L 23/4006 165/185 |
| 2009/0308573 A1 * | 12/2009 | Sun | ..................... | H01L 23/3672 165/80.3 |

* cited by examiner

*Primary Examiner* — Michail V Datskovskiy
(74) *Attorney, Agent, or Firm* — Chun-Ming Shih; HDLS IPR SERVICES (57) ABSTRACT

A heat sink fastener includes a heat sink assembly, a first stand, a second stand, a fastening plate, a fastening member, and a movable bar. The first stand includes a fastening portion. The second stand includes a restriction portion. The fastening plate is connected to the heat sink assembly. The fastening plate includes a hook portion, an extension portion, and a through hole. The hook portion is engaged with the fastening portion. The extension portion contacts with the restriction portion. The fastening member is inserted through the through hole and secured the second stand. The fastening member includes a bolt and a screw nail. The screw nail is provided with a pushing portion. The movable bar is connected to the second stand. The movable bar includes a pivot shaft, a restriction end restricting the pushing portion from movement, and a release end releasing the pushing portion to move.

15 Claims, 8 Drawing Sheets

HEAT SINK FASTENER

BACKGROUND

1. Technical Field

The present invention relates to a heat sink fastener and, in particular, to a heat sink fastener for quick securement of a heat sink assembly.

2. Related Art

Along with rapid development of the electronic industries, the demand for greater speed of chips in the semiconductor industry has led to a high level of chip integration. As a result, a great amount of heat is generated during the operation of the chips and causes a temperature increase of the system, thus compromising the stability of the system. In order to ensure normal operation of the system, the chips are normally installed with heat sinks to dissipate the heat generated from the chips.

A conventional heat sink generally includes a heat dissipation member and a plurality of screws for securement. An electronic component, e.g. an integrated chip, is disposed in the circuit board. Four screw holes are respectively disposed at the four corners of the electronic component. The heat sink has four through holes corresponding to the four screw holes of the circuit board. Four screws are inserted in the through holes of the heat sink to be threadedly fastened in the screw holes of the circuit board, so that the heat sink can contact the electronic component, and the heat sink can be secured onto the circuit board to dissipate heat.

However, since the screws are rigid, the heat sink is in rigid contact with the electronic component. The rigid contact easily causes the heat sink to apply uneven force to the electronic component, thereby causing bad contact between the heat sink and the electronic component, and consequently compromising the heat dissipation efficiency of the heat sink. Furthermore, the rigid structure of the screw results in a rigid connection between the heat sink and the circuit board, thereby easily causing the heat sink to exert uneven force to the circuit board, thus resulting in deformation of the circuit board.

In the existing heat sinks, tools are usually required to unfasten or fasten the screws, which is time and labor consuming. Furthermore, due to the compact space in the electronic system, when fastening or unfastening the screws, other electronic components may be touched, and thus may be damaged.

BRIEF SUMMARY

It is an objective of the present invention to provide a heat sink fastener which achieves quick securement without the use of tools.

It is another objective of the present invention to provide a heat sink fastener which facilitates handy operation and allows easy installation of the heat sink.

Accordingly, the present invention provides a heat sink fastener for use with a chip disposed on a substrate. The heat sink fastener includes a heat sink assembly, a first stand, a second stand, a fastening plate, a fastening member, and a movable bar. The first stand includes a fastening portion. The second stand includes a restriction portion disposed corresponding to the first stand. The fastening plate is connected to the heat sink assembly and in contact with a surface of the chip. The fastening plate includes a hook portion, an extension portion corresponding to the hook portion, and a through hole formed on the extension portion. The hook portion is engaged with the fastening portion. The extension portion is in contact with the restriction portion. The fastening member is resiliently inserted in the through hole and secured onto the second stand. The fastening member includes a bolt and a screw nail connected to the bolt. One end of the screw nail is provided with a pushing portion. A movable bar is rotatably and pivotally connected to the second stand. The movable bar includes a pivot shaft, a restriction end restricting the pushing portion from movement, and a release end releasing the pushing portion to move. The restriction end and the release end are disposed at two ends of the pivot shaft, respectively.

Preferably, the first stand further includes a first platform and a first side plate perpendicular to the first platform. The fastening portion is disposed on the first side plate, the second stand includes a second platform and a second side plate perpendicular to the second platform. The restriction portion is vertically connected to the second side plate.

Preferably, the bolt further includes a screw head and a screw shaft connected to the screw head. An inner screw hole is formed at one end of the screw shaft. The screw nail includes a screw nail shaft threadedly connected to the inner screw hole, a connection rod connected to the pushing portion, and a flange. The connection rod is disposed between the flange and the pushing portion.

It is preferable that the fastening member further includes a first resilient element, the first resilient element is disposed between the screw head and the extension portion, and the first resilient element can bring the pushing portion into disengagement with the restriction end. An outer diameter of the flange is larger than an outer diameter of the pushing portion, and the pushing portion is cone-shaped.

It is preferable that the movable bar further includes a second resilient element connected to the pivot shaft and a pivot recess formed at the restriction end, and the pivot recess is engaged with the pushing portion.

DETAILED DESCRIPTION

In the following, detailed descriptions along with accompanied drawings are given to better explain the features and technical contents of the present invention. However, the following descriptions and the accompanied drawings are for reference and illustration only, and are not intended to limit the scope of the present invention.

FIGS. 1 to 4 show a heat sink fastener of the present invention, which is for use with a chip 20 disposed on a substrate 10. According to the present embodiment, the substrate 10 is a motherboard or a circuit board. The chip 20 includes, but is not limited to, an integrated chip or a graphics processing unit. Furthermore, the substrate 10 is provided with a plurality of assembly protruding pillars disposed around the chip 20 for securement with the heat sink fastener.

Figure 1:
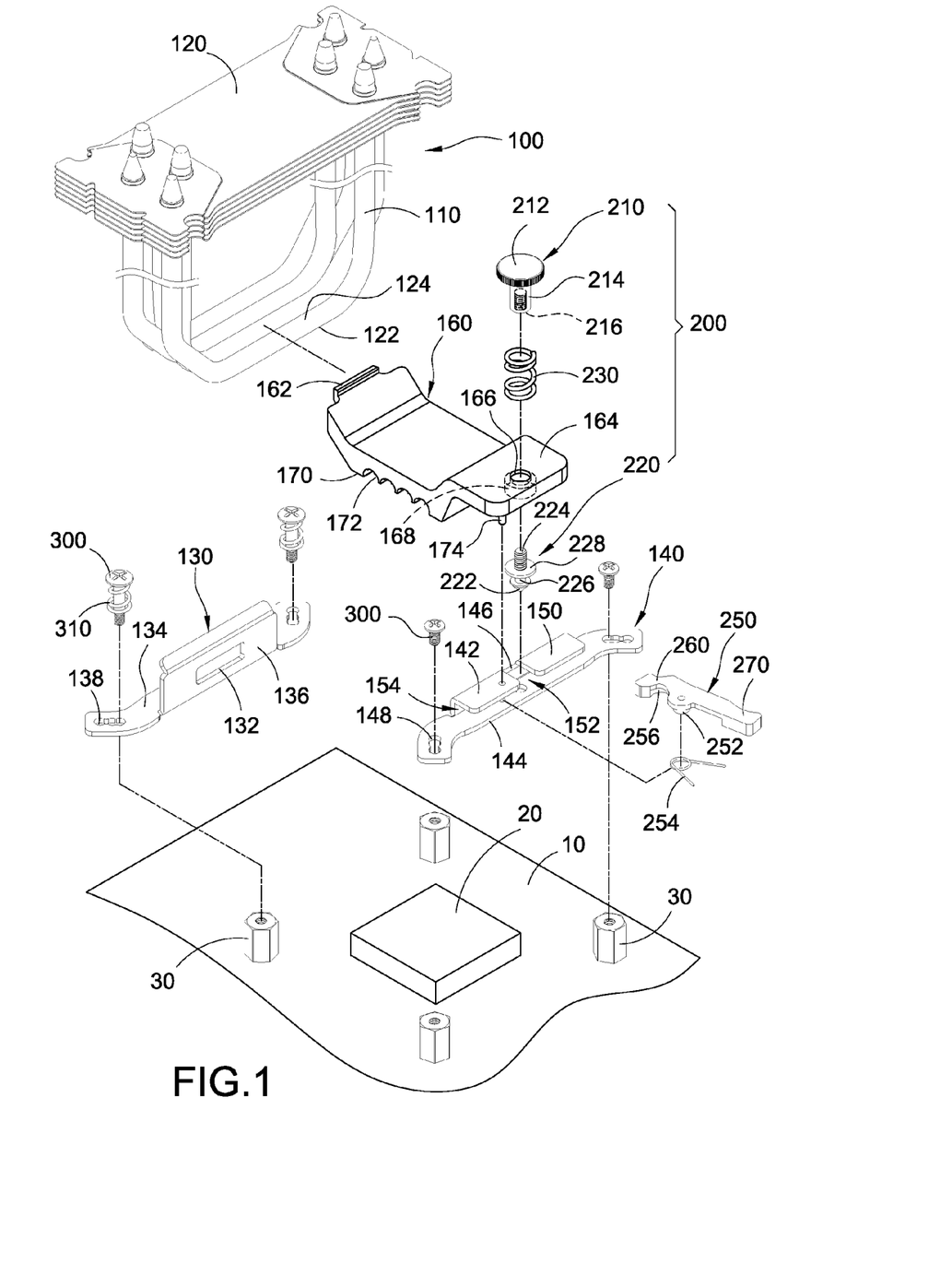
FIG. 1 is an exploded view of the present invention, according to one embodiment.
Figure 2:
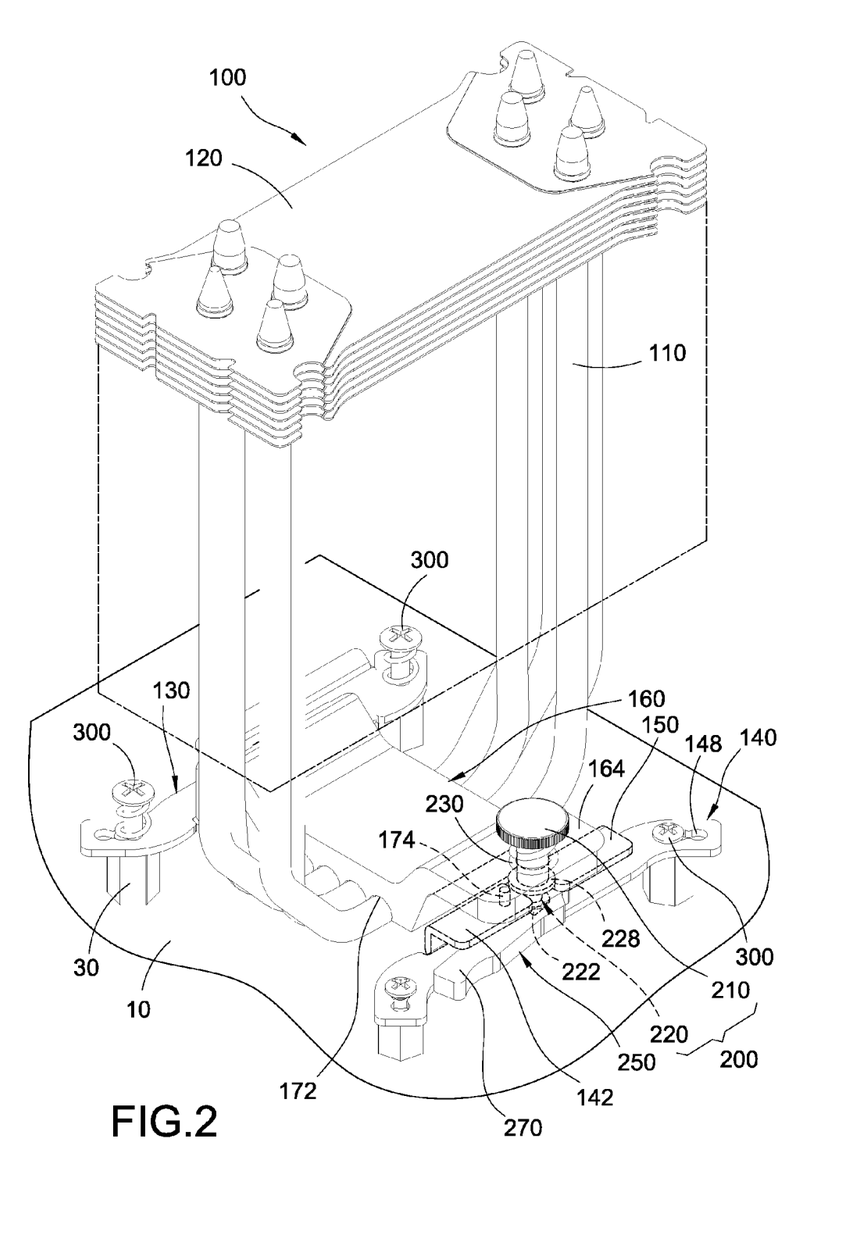
FIG. 2 is a perspective view of the present invention, according to one embodiment.
Figure 3:
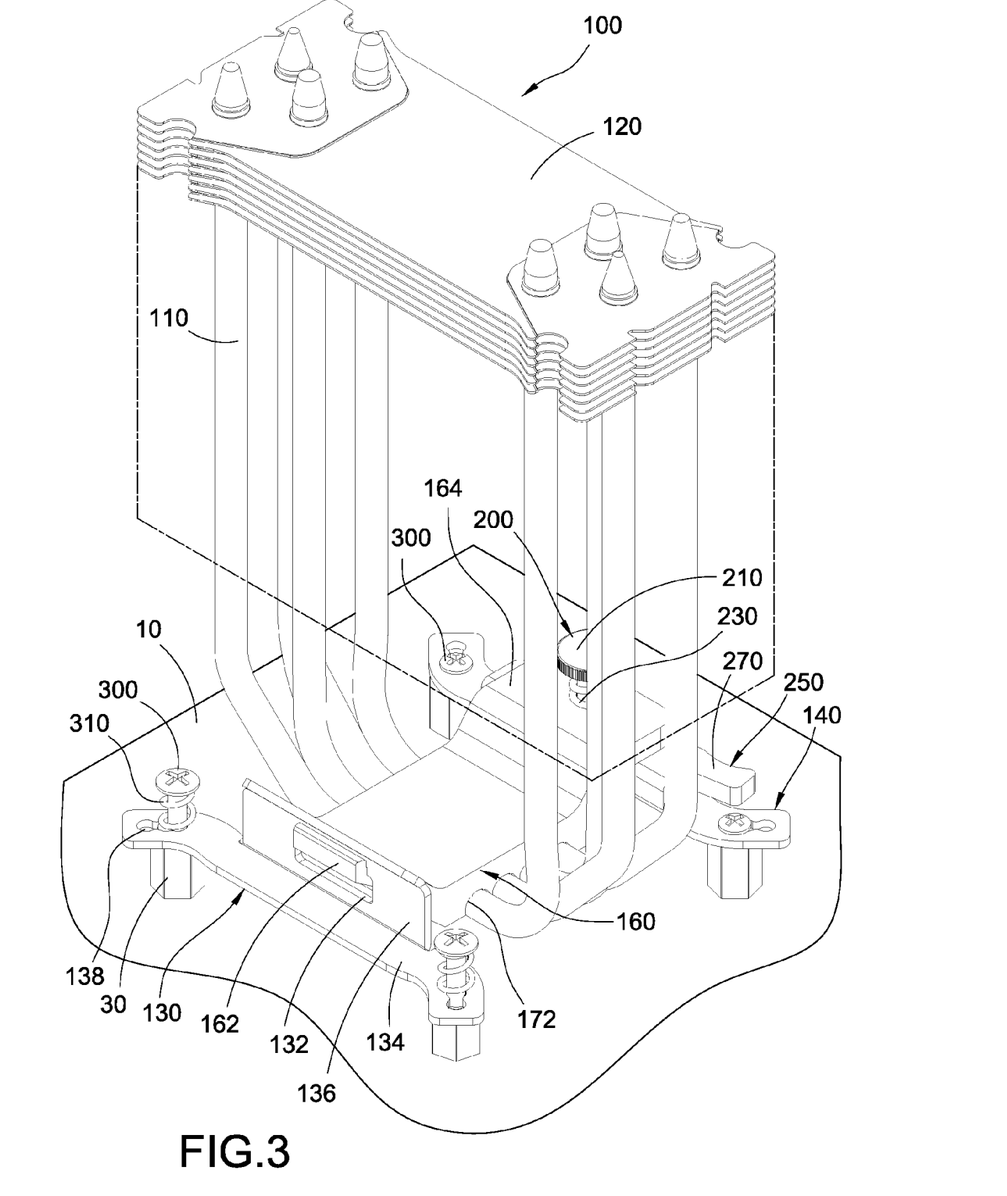
FIG. 3 is another perspective view of the present invention, viewed from another viewing angle, according to one embodiment.
Figure 4:
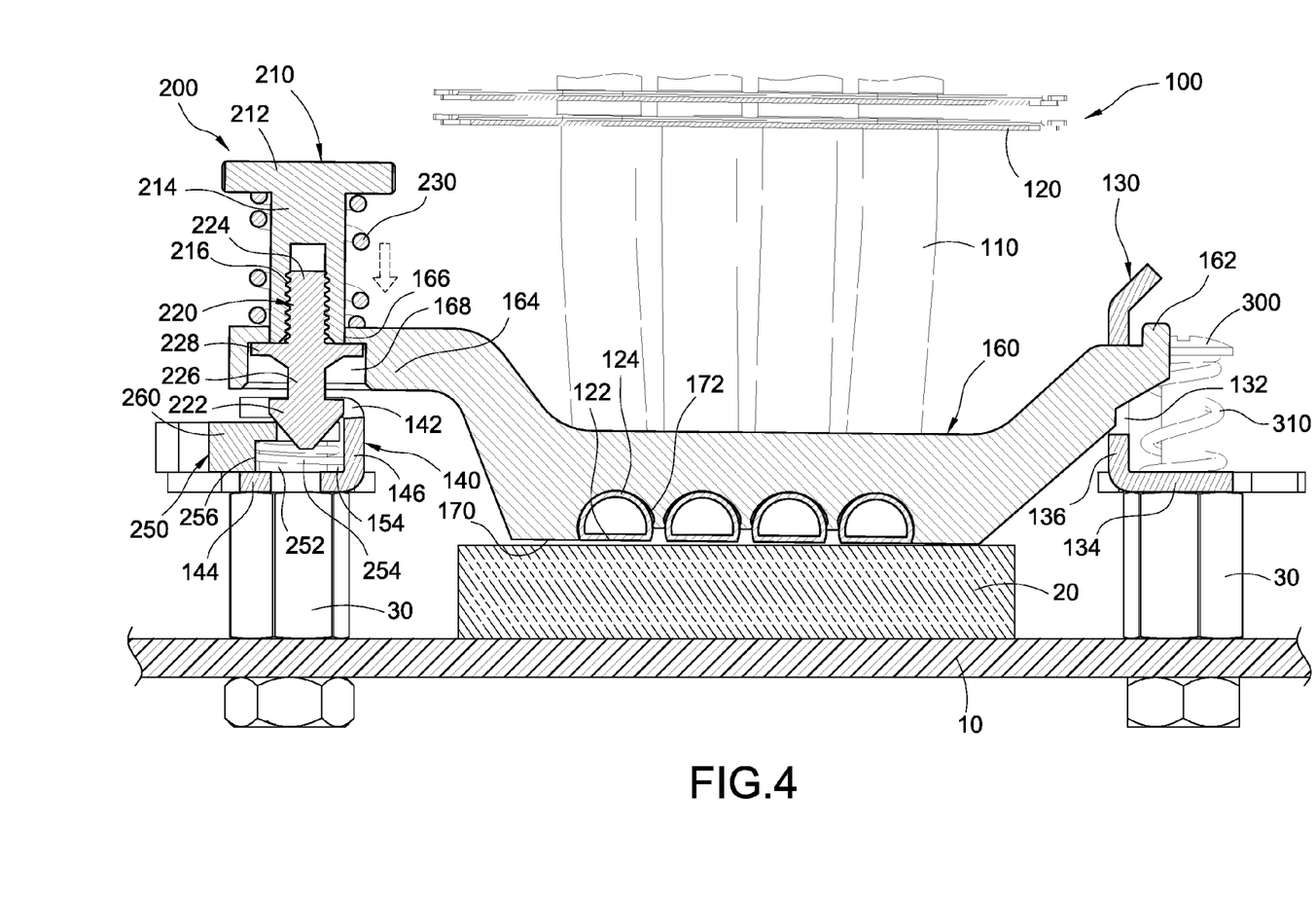
FIG. 4 is a cross-sectional view of the present invention, illustrating that a fastening member pushes one end (a restriction end) of a movable bar.

According to the embodiment shown in FIGS. 1 to 3, the heat sink fastener comprises a heat sink assembly 100, a first stand 130, a second stand 140, a fastening plate 160, a fastening member 200, and a movable bar 250. The heat sink assembly 100 comprises a plurality of heat pipes 110 and a plurality of fins 120, and the fins 120 are disposed overlappingly on each of the heat pipes 110. Each of the heat pipes 110 is inserted through the fastening plate 160, and together with the fastening plate 160 contact a surface of the chip 20 so as to dissipate heat. As shown in FIG. 1, one side surface of the fastening plate 160 further includes a pressing surface 170 provided with a plurality of trenches 172, and the heat pipes 110 are positioned in the trenches 172 respectively. Moreover, each of the heat pipes 110 partially includes a plane portion 122 and an arc portion 124 connected to the plane portion 122, each of the plane portions 122 is disposed flush with the pressing surface 170, and each of the arc portions 124 is in contact with a surface of each of the trenches 172, as shown in FIG. 4.

The first stand 130 includes a fastening portion 132. The second stand 140 includes a restriction portion 142 disposed corresponding to the first stand 130. Referring to FIG. 1, the first stand 130 further includes a first platform 134 and a first side plate 136 perpendicular to the first platform 134, the fastening portion 132 is disposed on the first side plate 136. The second stand 140 includes a second platform 144 and a second side plate 146 perpendicular to the second platform 144. The restriction portion 142 is vertically connected to the second side plate 146. According to the present embodiment, the restriction portion 142 further includes two restriction plates 150, a gap 152 is formed between the two restriction plates 150, and one end (i.e. a pushing portion) of the fastening member 200 is vertically movable in the gap 152. A restriction space 154 is formed between the second platform 144 and each of the restriction plates 150 for accommodating the movable bar 250.

The fastening plate 160 is connected to the heat sink assembly 100 and is in contact with a surface of the chip 20. The fastening plate 160 includes a hook portion 162, an extension portion 164 corresponding to the hook portion 162, and a through hole 166 formed on the extension portion 164. Referring to FIGS. 2 and 3, the hook portion 162 is engaged with the fastening portion 132, and the extension portion 164 is in contact with the restriction portion 142. In the present embodiment, the fastening portion 132 is, for example, an opening; the hook portion 162 is, for example, a protruding portion. The protruding portion protrudes out of the opening to hook the first side plate 136. However, in other embodiments, the fastening portion 132 and the hook portion 162 can have different designs, and the present invention is not intended to limit the designs thereof.

The fastening member 200 is resiliently inserted in the through hole 166 and is secured to the second stand 140, so as to enable the fastening plate 160 to quickly secure the heat sink assembly 100 without the use of tools. The fastening member 200 includes a bolt 210 and a screw nail 220 connected to the bolt 210. One end of the screw nail 220 is provided with a pushing portion 222 having a cone shape. According to the embodiment shown in FIG. 1, the bolt 210 further includes a screw head 212 and a screw shaft 214 connected to the screw head 212. An inner screw hole 216 is formed at one end of the screw shaft 214. The screw nail 220 includes a screw nail shaft 224 threadedly connected to the inner screw hole 216, a connection rod 226 connected to the pushing portion 222, and a flange 228. The connection rod 226 is disposed between the flange 228 and the pushing portion 222.

Referring to FIG. 1, an outer diameter of the flange 228 is larger than an outer diameter of the pushing portion 222, and is greater than the gap 152. Therefore, the restriction portion 142 (i.e. the restriction plate 150) can contact against the flange 228 so as to restrict the fastening member 200 from movement. Furthermore, the extension portion 164 is further provided with a recess 168, the recess 168 communicates with the through hole 166, an inner diameter of the recess 168 is larger than an inner diameter of the through hole 166, so the flange 228 of the fastening member 200 can contact against an inner wall of the recess 168 and the restriction plate 150.

Referring to FIG. 4, the fastening member 200 further includes a first resilient element 230, so the fastening member 200 can provide a reaction force to the extension portion 164 to move upwards automatically (i.e. to recoil). It is preferable that the first resilient element 230 is disposed between the screw head 212 and the extension portion 164, and the first resilient element 230 can releases the pushing portion 222 of the fastening member 200 from the restriction end 260.

A movable bar 250 is rotatably and pivotally connected to the second stand 140. The movable bar 250 includes a pivot shaft 252, a restriction end 260 restricting the pushing portion 222 from movement, and a release end 270 releasing the pushing portion 222 to move. The restriction end 260 and the release end 270 are disposed at two ends of the pivot shaft 252, respectively. The embodiment shown in FIG. 1 further includes a positioning pillar 174 disposed on the extension portion 164, the positioning pillar 174 is inserted in the pivot shaft 252 to secure the movable bar 252 onto the second stand 174. The movable bar 250 further includes a second resilient element 254 connected to the pivot shaft 252 and a pivot recess 256 formed at the restriction end 260, and the pivot recess 256 is engaged with the pushing portion 222.

Moreover, the embodiment shown in FIG. 1 further includes a plurality of fixation elements 300 such as screws or other suitable elements for securement. A compression spring 310 may be added to the fixation element 300 as required to enhance the securement ability. The fixation elements 300 are fastened to the assembly protruding pillars 30 respectively to secure the first stand 130 and the second stand 140 to the substrate 10. In other words, two ends of the first platform 134 and the second platform 144 are provided with two assembly holes 138 and two assembly holes 148 for fastening the fixation elements 300 therein respectively.

Figure 5:
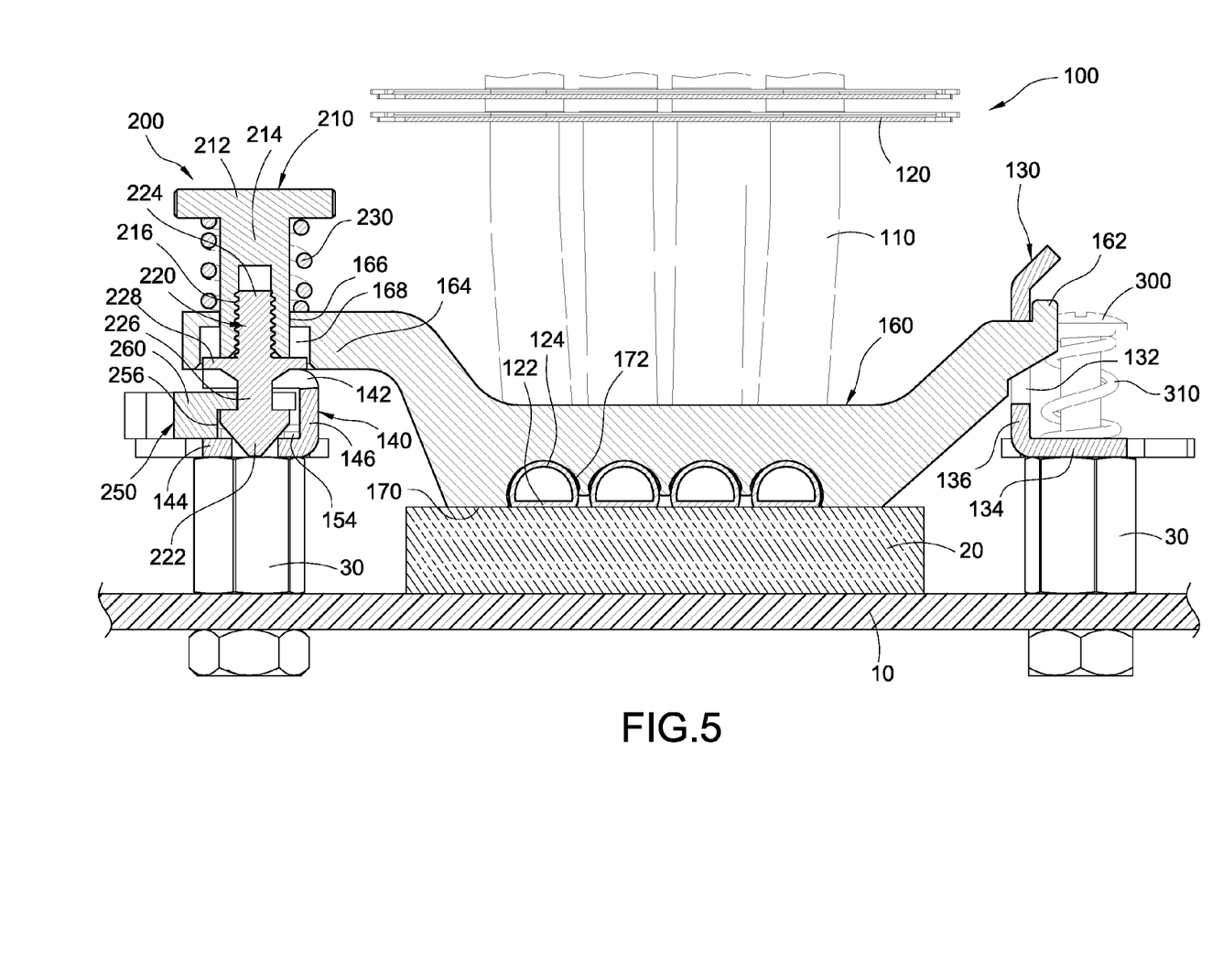
FIG. 5 is a cross-sectional view of the present invention, illustrating that the fastening member is engaged with the restriction end to secure the fastening plate.
Figure 6:
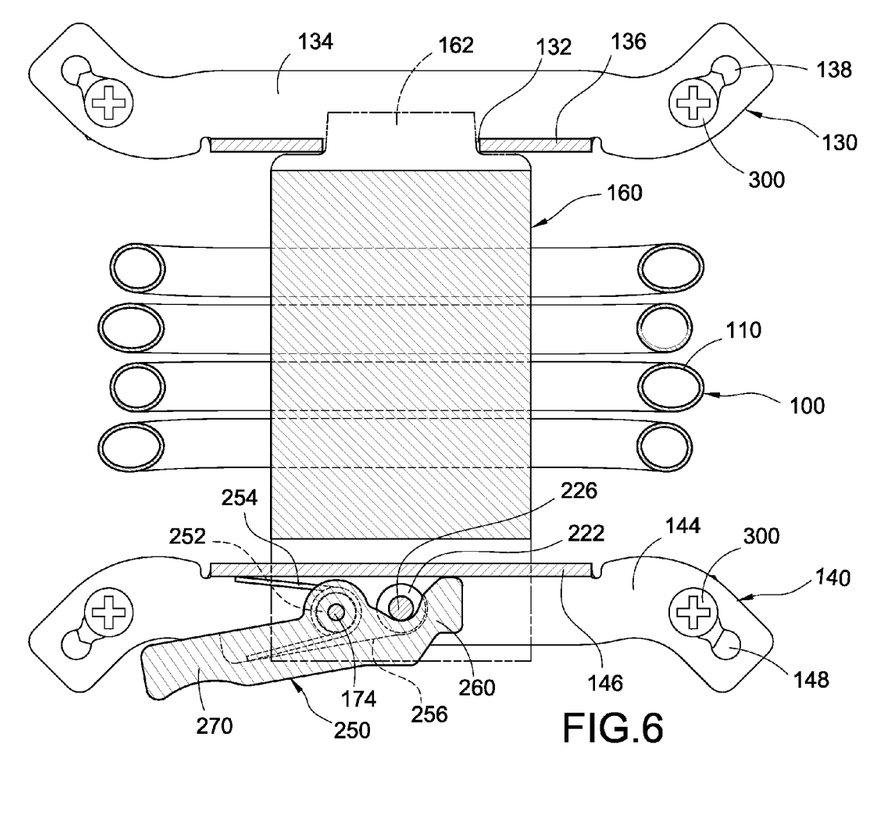
FIG. 6 is another cross-sectional view of FIG. 5, the view being taken at a different angle from that of FIG. 5.

Referring to FIG. 4, when the hook portion 162 of the fastening plate 160 is engaged with the fastening portion 132 of the first stand 130, a user can easily press down the fastening member 200 disposed at the extension portion 164 toward the movable bar 250 of the second stand 140 for engagement. Accordingly, the heat sink assembly 100 is quickly secured in place without the use of tools, thereby preventing other electronic components (not illustrated) on the substrate 10 from being damaged. Furthermore, when the user press down the fastening member 200, the pushing portion 222 of the fastening member 200 moves toward the second stand 140 and pushes against the restriction end 260 until the pushing portion 222 enters the restriction space 154 to engage the pivot recess 256, as shown in FIGS. 5 and 6.

It should be noted that, since the movable bar 250 is restricted by the second resilient element 254 which is preferably a torsion spring, the restriction end 260 of the movable bar 250 is kept in contact with the second side plate 146. Therefore, upon exertion of a small force by the user, the fastening member 200 overcomes a recoil force of the second resilient element 254 to engage the pushing portion 222 with the pivot recess 256, and thus securement of the heat sink assembly 100 is completed. Referring to FIG. 5, the pressing surface 170 of the fastening plate 160 is preferably made of copper, aluminum, or a combination thereof. The pressing surface 170 and each of the plane portions 122 of the heat pipes 110 are in contact with the surface of the chip 20, and each of the arc portions 124 is in contact with a respective one of the trenches 172, and whereby the heat generated from the chip 20 can be dissipated out through the heat sink assembly 100.

Figure 7:
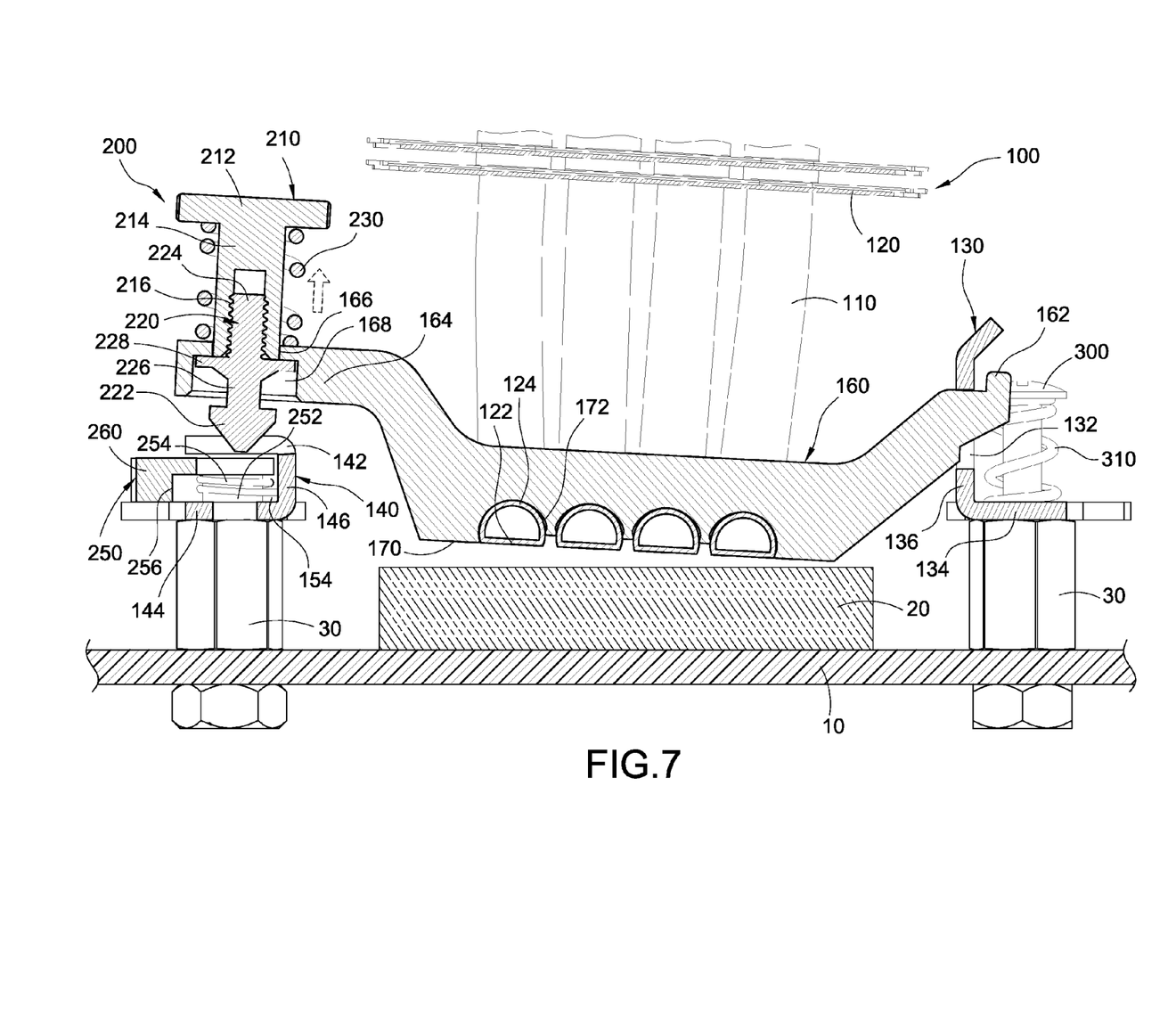
FIG. 7 is a cross-sectional view of the present invention, illustrating that the other end (release end) of the movable bar is released to resiliently bring the fastening member into disengagement from the restriction end.
Figure 8:
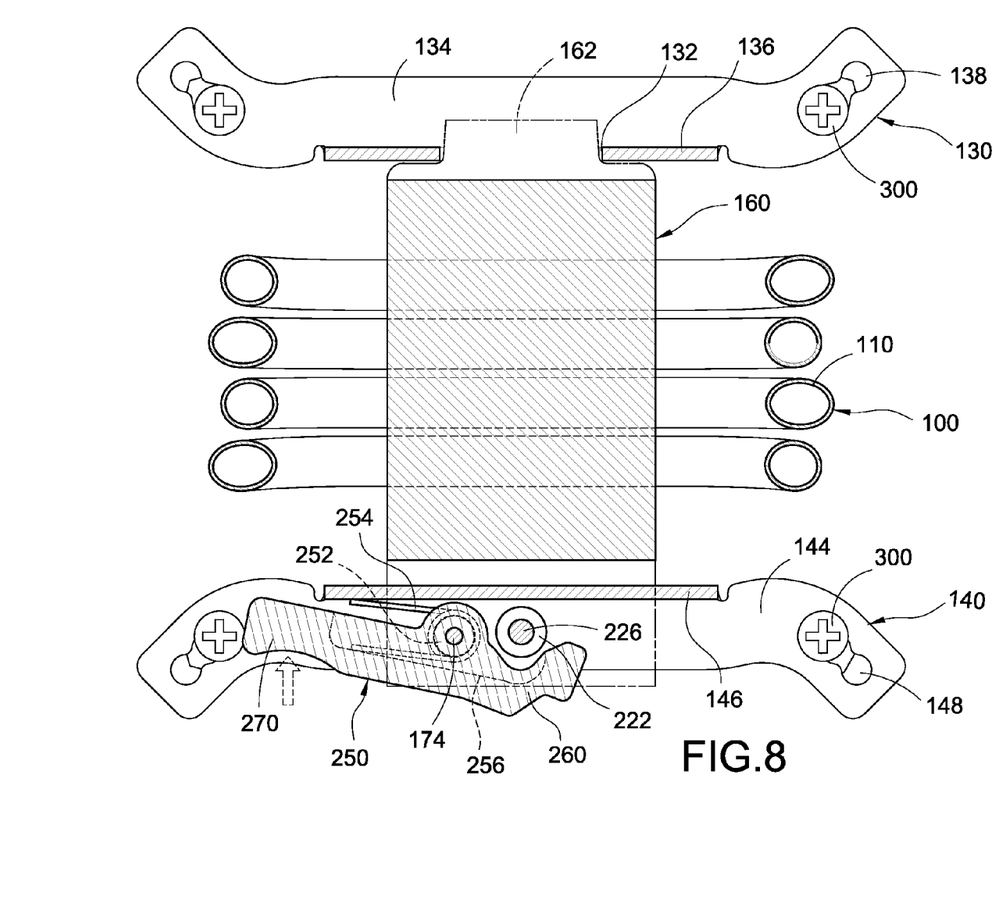
FIG. 8 is another cross-sectional view of FIG. 7, the view being taken at a different angle from that of FIG. 7.

Referring to FIGS. 7 and 8, when pressing down the release end 270 of the movable bar 250, the pushing portion 222 is released from the pivot recess 256 of the restriction end 260. The first resilient member 230 of the fastening member 200 generates a recoil force to pull upward the pushing portion 222 to release the same from the restriction end 260 (or to release the pushing portion 222 from the second stand 140). At this point, the fastening plate 160 moves upward together with the fastening member 200, so the pressing surface 170 of the fastening plate 160 is removed from contact with the surface of the chip 10.

It is to be understood that the above descriptions are merely preferable embodiments of the present invention and are not intended to limit the scope of the present invention. Equivalent changes and modifications made in the spirit of the present invention are regarded as falling within the scope of the present invention.

What is claimed is:

1. A heat sink fastener for using with a chip disposed on a substrate, the heat sink fastener comprising:
    a heat sink assembly;
    a first stand including a fastening portion;
    a second stand including a restriction portion disposed corresponding to the first stand;
    a fastening plate connected to the heat sink assembly and in contact with a surface of the chip, the fastening plate including a hook portion, an extension portion corresponding to the hook portion, and a through hole formed on the extension portion, the hook portion being engaged with the fastening portion, the extension portion being in contact with the restriction portion;
    a fastening member resiliently inserted in the through hole and secured to the second stand, the fastening member including a bolt and a screw nail connected to the bolt, one end of the screw nail being provided with a pushing portion; and
    a movable bar rotatably and pivotally connected to the second stand, the movable bar including a pivot shaft, a restriction end restricting the pushing portion from movement, and a release end releasing the pushing portion to move, the restriction end and the release end being disposed at two ends of the pivot shaft respectively.

2. The heat sink fastener of claim 1, wherein the heat sink assembly comprises a plurality of heat pipes and a plurality of fins, and the fins are disposed overlappingly on each of the heat pipes.

3. The heat sink fastener of claim 2, wherein one side surface of the fastening plate further includes a pressing surface provided with a plurality of trenches, and the heat pipes are positioned in the trenches respectively.

4. The heat sink fastener of claim 3, wherein each of the heat pipes partially includes a plane portion and an arc portion connected to the plane portion, each of the plane portions is disposed flush with the pressing surface, and each of the arc portions is in contact with a surface of each of the trenches.

5. The heat sink fastener of claim 1, wherein the first stand further includes a first platform and a first side plate perpendicular to the first platform, the fastening portion is disposed on the first side plate, the second stand includes a second platform and a second side plate perpendicular to the second platform, and the restriction portion is vertically connected to the second side plate.

6. The heat sink fastener of claim 5, wherein the restriction portion further includes two restriction plates, a gap is formed between the two restriction plates, and one end of the fastening member is vertically movable in the gap.

7. The heat sink fastener of claim 5, wherein the fastening portion is an opening, the hook portion is a protruding portion, the protruding portion protrudes out of the opening to hook the first side plate, the fastening member pushes against the restriction end to bring the pushing portion into engagement with the restriction end.

8. The heat sink fastener of claim 5, further comprising a plurality of fixation elements, the fixation elements securing the first stand and the second stand.

9. The heat sink fastener of claim 8, wherein two ends of the first platform and the second platform are provided with two assembly holes for fastening the fixation elements respectively.

10. The heat sink fastener of claim 1, wherein the bolt further includes a screw head and a screw shaft connected to the screw head, an inner screw hole is formed at one end of the screw shaft, the screw nail includes a screw nail shaft threadedly connected to the inner screw hole, a connection rod connected to the pushing portion, and a flange, the connection rod is disposed between the flange and the pushing portion.

11. The heat sink fastener of claim 10, wherein the fastening member further includes a first resilient element, the first resilient element is disposed between the screw head and the extension portion, and the first resilient element releases the pushing portion from the restriction end.

12. The heat sink fastener of claim 10, wherein an outer diameter of the flange is larger than an outer diameter of the pushing portion, and the pushing portion is cone-shaped.

13. The heat sink fastener of claim 10, wherein the extension portion is further provided with a recess, the recess communicates with the through hole, an inner diameter of the recess is larger than an inner diameter of the through hole, and the flange is in contact with an inner wall of the recess and the restriction portion.

14. The heat sink fastener of claim 1, wherein the movable bar further includes a second resilient element connected to the pivot shaft and a pivot recess formed at the restriction end, and the pivot recess is engaged with the pushing portion.

15. The heat sink fastener of claim 1, further comprising a positioning pillar disposed on the extension portion, the positioning pillar being inserted in the pivot shaft to secure the movable bar onto the second stand.

* * * * *